(12) United States Patent
Tanaka

(10) Patent No.: US 10,483,479 B2
(45) Date of Patent: Nov. 19, 2019

(54) METHOD OF MANUFACTURING ORGANIC LIGHT EMITTING DEVICE AND ORGANIC LIGHT EMITTING DEVICE

(71) Applicant: PIONEER CORPORATION, Bunkyo-ku, Tokyo (JP)

(72) Inventor: Akihiro Tanaka, Kawasaki (JP)

(73) Assignee: PIONEER CORPORATION, Tokyo (JP)

( * ) Notice: Subject to any disclaimer, the term of this patent is extended or adjusted under 35 U.S.C. 154(b) by 0 days.

(21) Appl. No.: 16/081,861

(22) PCT Filed: Mar. 1, 2016

(86) PCT No.: PCT/JP2016/056183
§ 371 (c)(1),
(2) Date: Aug. 31, 2018

(87) PCT Pub. No.: WO2017/149636
PCT Pub. Date: Sep. 8, 2017

(65) Prior Publication Data
US 2019/0067617 A1 Feb. 28, 2019

(51) Int. Cl.
*H01L 51/50* (2006.01)
*H01L 33/10* (2010.01)
(Continued)

(52) U.S. Cl.
CPC ...... *H01L 51/5056* (2013.01); *H01L 27/3206* (2013.01); *H01L 27/3283* (2013.01);
(Continued)

(58) Field of Classification Search
CPC ............ H01L 51/5056; H01L 51/5092; H01L 51/5072; H01L 51/5012; H01L 51/50; H05B 33/22; H05B 33/12; H05B 33/10
See application file for complete search history.

(56) References Cited

U.S. PATENT DOCUMENTS 8,471,463 B2   6/2013 Sumida et al.
8,803,853 B2   8/2014 Seo et al.
(Continued)

FOREIGN PATENT DOCUMENTS

JP   2006-196188 A   7/2006
JP   2012-142365 A   7/2012
(Continued)

OTHER PUBLICATIONS

International Search Report for related International Application No. PCT/JP2016/056183; dated May 31, 2016; 2 pages.

*Primary Examiner* — Tracie Y Green
(74) *Attorney, Agent, or Firm* — Procopio, Cory, Hargreaves & Savitch LLP

(57) ABSTRACT

A first light emitting unit includes a hole injection layer, a first hole transport layer, and a first light emitting layer. A second light emitting unit includes a hole injection layer, a second hole transport layer, a third hole transport layer, a third hole transport layer, and a second light emitting layer. The second hole transport layer is formed on the hole injection layer and includes a first hole transporting material. The third hole transport layer is formed on the second hole transport layer and includes a second hole transporting material. A fourth hole transport layer is formed on the third hole transport layer and includes the same material as the second hole transport layer, that is, the second hole transporting material. The third hole transport layer is formed by using a coating method, and the fourth hole transport layer is formed by a vapor deposition method.

16 Claims, 12 Drawing Sheets

(51) Int. Cl.
  *H05B 33/22* (2006.01)
  *H05B 33/10* (2006.01)
  *H01L 51/00* (2006.01)
  *H01L 27/32* (2006.01)

(52) U.S. Cl.
  CPC ........ *H01L 51/001* (2013.01); *H01L 51/0003* (2013.01); *H01L 51/5012* (2013.01); *H01L 51/5064* (2013.01); *H01L 51/5072* (2013.01); *H01L 51/5092* (2013.01); *H05B 33/10* (2013.01); *H05B 33/22* (2013.01)

(56) References Cited

U.S. PATENT DOCUMENTS

| | | | |
|---|---|---|---|
| 8,823,255 B2 | 9/2014 | Yoshinaga et al. | |
| 8,847,250 B2* | 9/2014 | Abe | H01L 27/3246 257/91 |
| 8,889,474 B2* | 11/2014 | Matsushima | H01L 27/3258 257/40 |
| 9,024,521 B2 | 5/2015 | Yoshinaga et al. | |
| 9,461,258 B2 | 10/2016 | Seo et al. | |
| 9,484,394 B2* | 11/2016 | Mori | H01L 27/3276 |
| 9,704,925 B2* | 7/2017 | Akiyama | H01L 51/5012 |
| 10,170,521 B2* | 1/2019 | Jung | H01L 27/3206 |
| 10,199,594 B2* | 2/2019 | Kim | H01L 27/3211 |
| 2007/0008257 A1 | 1/2007 | Seo et al. | |
| 2007/0241668 A1* | 10/2007 | Ottermann | G02B 1/11 313/504 |
| 2010/0265580 A1* | 10/2010 | Yun | C08F 2/48 359/485.01 |
| 2012/0223633 A1 | 9/2012 | Yoshinaga et al. | |
| 2013/0038204 A1 | 2/2013 | Sumida et al. | |
| 2013/0193418 A1 | 8/2013 | Ishikawa | |
| 2013/0234121 A1 | 9/2013 | Sonoyama | |
| 2013/0323867 A1 | 12/2013 | Yoshinaga et al. | |
| 2014/0346538 A1 | 11/2014 | Seo et al. | |
| 2017/0084672 A1 | 3/2017 | Seo et al. | |

FOREIGN PATENT DOCUMENTS

| | | |
|---|---|---|
| JP | 2012-186021 A | 9/2012 |
| JP | 2013-157277 A | 8/2013 |
| JP | 2013-179248 A | 9/2013 |
| JP | 2013-214496 A | 10/2013 |
| JP | 2014-127303 A | 7/2014 |
| WO | 2013-190636 A1 | 12/2013 |

* cited by examiner (a)

(b)

(a)

(b)

(a)

(b)

US 10,483,479 B2

METHOD OF MANUFACTURING ORGANIC LIGHT EMITTING DEVICE AND ORGANIC LIGHT EMITTING DEVICE

CROSS-REFERENCE TO RELATED APPLICATIONS

This application is a U.S. National Stage entry of PCT Application No: PCT/JP2016/056183 filed Mar. 1, 2016, the contents of which are incorporated herein by reference.

TECHNICAL FIELD

The present invention relates to a method of manufacturing a light emitting device and a light emitting device.

BACKGROUND ART

An organic EL element is provided as one of light sources of light emitting devices such as lighting devices or display devices. The organic EL element has a configuration in which an organic layer is disposed between a first electrode and a second electrode. The organic layer has a multilayer structure in which a hole injection layer, a hole transport layer, a light emitting layer, an electron transport layer, and an electron injection layer are stacked.

Conventionally, a vacuum film formation method (for example, vapor deposition method) has been used as a method of manufacturing each layer constituting the organic layer. On the contrary, recently, a case where the organic layer is formed by a coating method is being examined. However, in the current circumstances, it is difficult to form all layers of the organic layer by a coating method. For example, Patent Document 1 discloses forming a hole injection layer and a portion of a hole transport layer by a coating method and forming the remaining portion of the hole transport layer and a light emitting layer by a vapor deposition method.

Patent Document 2 also discloses forming a portion of a hole transport layer by a coating method and forming the remaining portion of the hole transport layer and a light emitting layer by a vapor deposition method. Patent Document 2 discloses also forming an electron transport layer positioned on the light emitting layer by a vapor deposition method.

RELATED DOCUMENT

Patent Document

[Patent Document 1] Japanese Laid-open Patent Application Publication NO. 2012-142365
[Patent Document 2] Japanese Laid-open Patent Application Publication NO. 2014-127303

SUMMARY OF THE INVENTION

Technical Problem

A display device or a lighting device in which a light emission color is adjustable includes plural kinds of light emitting units having different light emission colors. Basically, the light emission color of the light emitting unit is determined by a material used in the light emitting layer. Therefore, in a case where plural kinds of light emitting units having different light emission colors are mixed and mounted on one substrate, both a light emitting unit in which a light emitting layer is formed by a coating method and a light emitting unit in which a light emitting layer is formed by a vapor deposition method may be provided on the one substrate. In such a case, the layer formed by the coating method in the former light emitting unit is thicker than the layer formed in the latter light emitting unit. Therefore, the dry state of the coating material configuring the organic layer is different between the former light emitting unit and the latter light emitting unit. In this case, making the dry state of all the plural kinds of light emitting units the same is difficult. As a result, the quality of some light emitting unit is deteriorated.

An exemplary object of the present invention is to prevent the quality of some light emitting units from being deteriorated in a case where plural kinds of light emitting units having different light emission colors are mixed and mounted on one substrate.

Solution To Problem

According to the invention described in claim 1, there is provided a method of manufacturing a light emitting device, which includes a first step of coating a first region of a substrate in which a first light emitting unit is formed with a light emitting material, a second step of coating a second region of a substrate in which a second light emitting unit is formed with a coating material, before or after the first step, a third step of drying the light emitting material in the first region and the coating material in the second region after the first step and the second step, and a fourth step of depositing a light emitting material in the second region after the third step.

According to the invention described in claim 11, there is provided a light emitting device which includes a first light emitting unit formed in a first region of a substrate, and a second light emitting unit formed in a second region of the substrate. The first light emitting unit includes a first hole injection layer, a first hole transport layer positioned on the first hole injection layer, and a first light emitting layer positioned on the first hole transport layer. The second light emitting unit includes a second hole injection layer, a second hole transport layer which is positioned on the second hole injection layer and includes a first hole transporting material, a third hole transport layer which is positioned on the second hole transport layer and includes a second hole transporting material, a fourth hole transport layer which is positioned on the third hole transport layer and includes the second hole transporting material, and a second light emitting layer positioned on the fourth hole transport layer.

According to the invention described in claim 16, there is provided a light emitting device which includes an insulating layer which is formed on the substrate and includes a plurality of openings, a partition wall positioned on a portion of the insulating layer, which is positioned between adjacent openings, a first light emitting unit positioned in a first opening among the openings, and a second light emitting unit positioned in a second opening among the openings. The first light emitting unit includes a first hole injection layer, a first hole transport layer positioned on the first hole injection layer, and a first light emitting layer positioned on the first hole transport layer. The second light emitting unit includes a second hole injection layer, a second hole transport layer which is positioned on the second hole injection layer and is thicker than the first hole transport layer, and a second light emitting layer positioned on the second hole transport layer. The second hole injection layer and a portion of the second hole transport layer are not positioned on the partition wall and the remaining portion of the second hole transport layer and the second light emitting layer are positioned on the partition wall, the partition wall positioned to be adjacent to the second light emitting unit in a thickness direction.

BRIEF DESCRIPTION OF THE DRAWINGS

The above-described object, other objects, features, and advantages will become more apparent from the following description of the preferred embodiment and the accompanying drawings.

DESCRIPTION OF EMBODIMENTS

Hereinafter, an embodiment of the present invention will be described with reference to the drawings. In all the drawings, the same components are denoted by the same reference signs and descriptions thereof will not be repeated. In the embodiment, for example, expressions of a hole transport layer and a hole injection layer are used to mean a layer including a hole transporting material and a layer including a hole injection material, respectively.

Figure 1:
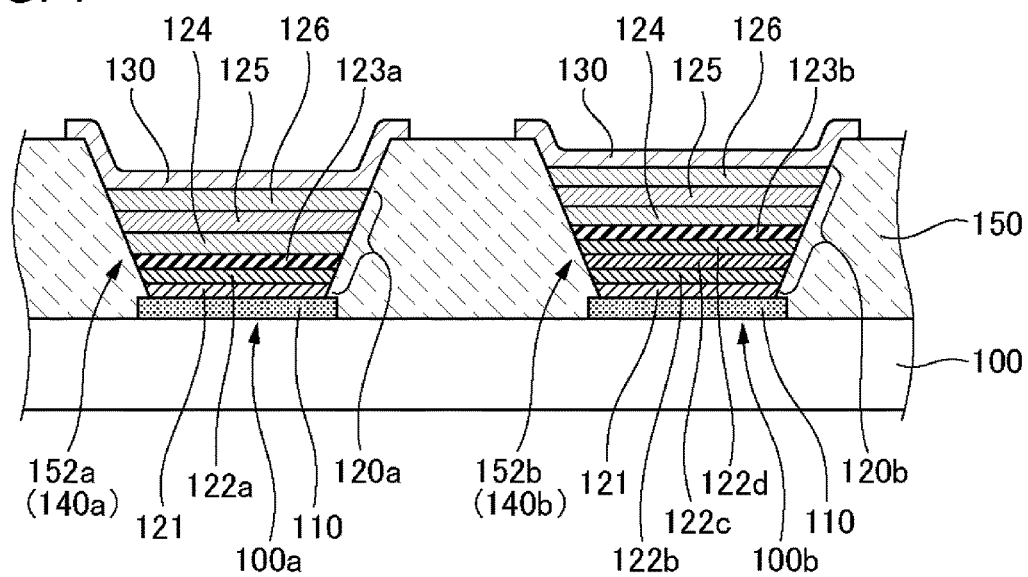
FIG. 1 is a sectional view illustrating a configuration of a light emitting device according to an embodiment.

FIG. 1 is a sectional view illustrating a configuration of a light emitting device 10 according to the embodiment. The light emitting device 10 according to the embodiment includes a substrate 100, a first light emitting unit 140a, and a second light emitting unit 140b. The first light emitting unit 140a is formed in a first region 100a of the substrate 100 and includes a hole injection layer (first hole injection layer) 121, a first hole transport layer 122a, and a first light emitting layer 123a. The second light emitting unit 140b is formed in a second region 100b of the substrate 100 and includes a hole injection layer (second hole injection layer) 121, a second hole transport layer 122b, a third hole transport layer 122c, a fourth hole transport layer 122d, and a second light emitting layer 123b. The second hole transport layer 122b is formed on the hole injection layer 121 and includes a first hole transporting material. The third hole transport layer 122c is formed on the second hole transport layer 122b and includes a second hole transporting material. The fourth hole transport layer 122d is formed on the third hole transport layer 122c and includes the same material as the third hole transport layer 122c, that is, the second hole transporting material. The third hole transport layer 122c is formed by using a coating method. The fourth hole transport layer 122d is formed by using a vapor deposition method. Therefore, an interface is provided between the third hole transport layer 122c and the fourth hole transport layer 122d. The refractive index of the third hole transport layer 122c is different from the refractive index of the fourth hole transport layer 122d. The first hole transport layer 122a includes the same material as the second hole transport layer 122b, that is, the first hole transporting material. Details thereof will be described below.

Both the first light emitting unit 140a and the second light emitting unit 140b are formed on one surface of the substrate 100. The first light emitting unit 140a and the second light emitting unit 140b are defined by an insulating layer 150. The insulating layer 150 is formed using a photosensitive material such as polyimide. The insulating layer is formed to have a predetermined shape through exposure and developing steps. Specifically, the insulating layer 150 has a first opening 152a positioned over the first region 100a and a second opening 152b positioned over the second region 100b. The insulating layer 150 is formed after a first electrode 110 has been formed and before the hole injection layer 121 is formed. However, the insulating layer 150 need not be formed.

The first light emitting unit 140a includes the first electrode 110, a first organic layer 120a, and a second electrode 130. The second light emitting unit 140b includes the first electrode 110, a second organic layer 120b, and the second electrode 130. Both the first organic layer 120a and the second organic layer 120b are positioned between the first electrode 110 and the second electrode 130. The first organic layer 120a is positioned on the inner side of the first opening 152a. The second organic layer 120b is positioned on the inner side of the second opening 152b. Therefore, the first light emitting unit 140a is positioned on the inner side of the first opening 152a, and the second light emitting unit 140b is positioned on the inner side of the second opening 152b. The first light emitting unit 140a and the second light emitting unit 140b may be bottom emission type light emitting units or top emission type light emitting units.

In a case where the first light emitting unit 140a and the second light emitting unit 140b are the bottom emission type, the substrate 100 is formed of a light transmitting material such as glass or a light transmitting resin. A surface of the substrate 100 on an opposite side of the first electrode 110 serves as a light emission surface of the light emitting device 10. On the other hand, in a case where the first light emitting unit 140a and the second light emitting unit 140b are the top emission type, the substrate 100 may be formed of the above-described light transmitting material or may be formed of a material which does not have light emitting properties. The substrate 100 is, for example, a polygon such as a rectangle. The substrate 100 may have flexibility. In a case where the substrate 100 has flexibility, the thickness of the substrate 100 is, for example, equal to or greater than 10 μm and equal to or smaller than 1000 μm. In particular, in a case where the substrate 100 has flexibility by using a glass material, the thickness of the substrate 100 is equal to or smaller than 200 μm, for example. In a case where the substrate 100 has flexibility by using a resin material, the substrate is formed by a material including polyethylene naphthalate (PEN), polyethersulfone (PES), polyethylene terephthalate (PET), or polyimide, as an example of the material of the substrate 100. In a case where the substrate 100 includes a resin material, an inorganic barrier film of SiNx, SiON, or the like is formed on at least a light emitting surface (preferably, both surfaces) of the substrate 100 in order to suppress permeation of moisture through the substrate 100.

At least one of the first electrode 110 and the second electrode 130 is a transparent electrode having optical transparency. For example, in a case where the first light emitting unit 140a and the second light emitting unit 140b are the bottom emission type, at least the first electrode 110 is a transparent electrode. In a case where the first light emitting unit 140a and the second light emitting unit 140b are the top emission type, at least the second electrode 130 is a transparent electrode. Meanwhile, both the first electrode 110 and the second electrode 130 may be transparent electrodes. In this case, the light emitting device 10 is a dual emission type light emitting device.

A transparent conductive material constituting the transparent electrode is a material including metal, for example, a metal compound such as indium tin oxide (ITO), indium zinc oxide (IZO), indium tungsten zinc oxide (IWZO), and zinc oxide (ZnO). The thickness of the first electrode 110 is, for example, equal to or greater than 10 nm and equal to or smaller than 500 nm. The first electrode 110 is formed by, for example, using a sputtering method or a vapor deposition method. The first electrode 110 may be made of a carbon nanotube or a conductive organic material such as PEDOT or PSS, or may be a thin metal electrode.

The electrode which does not have light transmitting properties among the first electrode 110 and the second electrode 130 includes, for example, a metal layer formed of metal selected from the first group consisting of Al, Au, Ag, Pt, Mg, Sn, Zn, and In, or an alloy of the metal selected from the first group. This electrode is formed by, for example, using a sputtering method or a vapor deposition method.

In a case where the first light emitting unit 140a and the second light emitting unit 140b are top emission type light emitting devices, the first electrode 110 may have a structure in which a metal layer and a transparent conductive layer are stacked in this order.

The second organic layer 120b of the second light emitting unit 140b includes the hole injection layer 121, the second hole transport layer 122b, the third hole transport layer 122c, the fourth hole transport layer 122d, the second light emitting layer 123b, a hole blocking layer 124, an electron transport layer 125, and an electron injection layer 126. One of the electron transport layer 125 and the electron injection layer 126 need not be formed.

The hole injection layer 121 is formed using a material through which holes move (organic material having hole mobility). The thickness of the hole injection layer 121 is, for example, equal to or greater than 50 nm and equal to or smaller than 100 nm. The hole injection layer 121 of the first organic layer 120a and the hole injection layer 121 of the second organic layer 120b are formed by the same step. As a method of forming the hole injection layer 121, a coating method, particularly, an ink jet method is provided. The material (hole injection material) forming the hole injection layer 121 is a conductive polymer material. For example, polythiophene-based materials such as poly(3,4-ethylene dioxythiophene)-poly(styrene sulfonate) (PEDOT-PSS) are exemplified. In addition, polymeric hole injection materials including arylamine derivatives, porphyrin derivatives, polystyrene derivatives, polypyrrole derivatives, polyaniline derivatives, polythiophene derivatives, and polyacetylene derivatives are exemplified. However, the hole injection material is not limited to the above-described materials.

Each of the first hole transport layer 122a, the second hole transport layer 122b, the third hole transport layer 122c, and the fourth hole transport layer 122d is formed using organic materials having hole mobility. In detail, the thickness of the first hole transport layer 122a is, for example, equal to or greater than 30 nm and equal to or smaller than 100 nm. The thickness of the second hole transport layer 122b is, for example, equal to or greater than 30 nm and equal to or smaller than 100 nm. As will be described later, the first hole transport layer 122a is formed by the same step as that for the second hole transport layer 122b. Thus, the thickness of the first hole transport layer 122a is substantially equal to the thickness of the second hole transport layer 122b. The thickness of the third hole transport layer 122c is, for example, equal to or greater than 10 nm and equal to or smaller than 40 nm. The thickness of the fourth hole transport layer 122d is, for example, equal to or greater than 10 nm and equal to or smaller than 40 nm. The first hole transport layer 122a and the second hole transport layer 122b are formed using a first hole transporting material. The third hole transport layer 122c and the fourth hole transport layer 122d are formed using a second hole transporting material. The first hole transporting material has a molecular weight higher than the second hole transporting material. The first hole transporting material is a polymeric hole transporting material. For example, triphenylamine-based materials such as poly[(9,9-dioctylfluorenyl-2,7-diyl)-co-(4,4'-(N-(4-sec-butylpheny 1))diphenylamine)] (TFB) are exemplified. In addition, polymeric hole transporting materials including anthracene derivatives, carbazole derivatives, polythiophene derivatives, polyfluorene derivatives, polyparaphenylene vinylene derivatives, and polyparaphenylene derivatives are exemplified. However, the first hole transporting material is not limited to the above materials. The second hole transporting material is a low molecular hole transporting material. For example, α-NPD (bis(N-(1-naphthyl-N-phenyl)benzidine)), m-MTDATA (4,4',4"-tris[phenyl (m-tolyl)amino]triphenylamine), TCTA (4,4',4"-tri(N-carbazole)triphenylamine), and 2-TNATA (4,4',4"-tris[2-naphthyl (phenyl)amino]triphenylamine) are exemplified. In addition, low molecular hole transporting materials including the following are exemplified: triphenylamine derivatives, oxadiazole derivatives, styrylamine derivatives, triazole derivatives, oxadiazole derivatives, imidazole derivatives, polyarylalkane derivatives, phenylenediamine derivatives, arylamine derivatives, oxazole derivatives, styrylanthracene derivatives, fluorenone derivatives, hydrazone derivatives, stilbene derivatives, triphenylene derivatives, and azatriphenylene derivatives. However, the second hole transporting material is not limited to the above materials. As in a case of the third hole transport layer 122c, when a film is formed with the second hole transporting material by a coating method, the material is dissolved in an organic solvent and then the film is formed with the resultant. Here, examples of the organic solvent include toluene, xylene, anisole, cyclohexanone, dodecylbenzene, cyclohexanol, tetralin, mesitylene, pseudocumene, dihydrobenzofuran, cyclohexylbenzene, 1-methylnaphthalene, p-anisyl alcohol, dimethylnaphthalene, 3-methylbiphenyl, 4-methylbiphenyl, 3-isopropylbiphenyl, monoisopropylnaphthalene, tetrahydrofuran, dichloroethane, chloroform, ethyl benzoate, and butyl benzoate. However, the organic solvent is not limited to the above materials. The above materials may be singly used or may be used in a mixture of two kinds or more thereof.

The first hole transport layer 122a and the second hole transport layer 122b are formed by performing coating with the first hole transporting material. The third hole transport layer 122c is formed by performing coating with the second hole transporting material. In detail, coating with the second hole transporting material for the third hole transport layer 122c is performed after performing coating with the first hole transporting material for the first hole transport layer 122a and the second hole transport layer 122b and drying. Therefore, an interface is provided between the second hole transport layer 122b and the third hole transport layer 122c. The first hole transport layer 122a, the second hole transport layer 122b, and the third hole transport layer 122c are formed by, for example, using a spin-coating method or may be formed by using another coating method (for example, ink jet method).

The fourth hole transport layer 122d is formed by using a vapor deposition method. As described above, the third hole transport layer 122c and the fourth hole transport layer 122d are formed by using film formation methods which are different from each other. Therefore, regardless of each of the third hole transport layer 122c and the fourth hole transport layer 122d being formed using the second hole transporting material, the interface is provided between the third hole transport layer 122c and the fourth hole transport layer 122d. Moreover, the refractive index of the third hole transport layer 122c is different from the refractive index of the fourth hole transport layer 122d. For example, the refractive index of the third hole transport layer 122c is lower than the refractive index of the fourth hole transport layer 122d.

Each of the first light emitting layer 123a and the second light emitting layer 123b is formed using materials which emit light by re-combination of electrons and holes. The light emission color of the first light emitting layer 123a is different from the light emission color of the second light emitting layer 123b. For example, the peak wavelength of an emission spectrum of the first light emitting layer 123a (that is, first light emitting unit 140a) is longer than the peak wavelength of an emission spectrum of the second light emitting layer 123b (that is, second light emitting unit 140b). The light emission color of the first light emitting layer 123a is, for example, green (having a peak wavelength which is equal to or greater than 500 nm and equal to or smaller than 550 nm) or red (having a peak wavelength which is equal to or greater than 600 nm and equal to or smaller than 680 nm). The light emission color of the second light emitting layer 123b is, for example, blue (having a peak wavelength which is equal to or greater than 430 nm and equal to or smaller than 480 nm).

The hole blocking layer 124 of the first organic layer 120a is in contact with a surface of the first light emitting layer 123a on an opposite side of the first hole transport layer 122a, and thus suppresses an occurrence of a situation in which holes penetrate the first light emitting layer 123a and then reach the electron transport layer 125 or the electron injection layer 126 of the first organic layer 120a. The same applies to the hole blocking layer 124 of the second organic layer 120b. The hole blocking layer 124 is formed using, for example, a material through which electrons move (organic material having electron mobility). The thickness of the hole blocking layer 124 is equal to or greater than 5 nm and equal to or smaller than 50 nm, for example. The first organic layer 120a and the second organic layer 120b need not include the hole blocking layer 124.

Each of the electron transport layer 125 of the first organic layer 120a and the electron transport layer 125 of the second organic layer 120b is formed using materials through which electrons can move (organic material having electron mobility). As such a material, for example, nitrogen-containing aromatic heterocyclic derivatives, aromatic hydrocarbon ring derivatives, dibenzofuran derivatives, dibenzothiophene derivatives, and silole derivatives are exemplified. The electron transport layer 125 of the first organic layer 120a and the electron transport layer 125 of the second organic layer 120b are formed by the same step as each other, and thus have thicknesses which are substantially equal to each other. The thickness of the electron transport layer 125 is equal to or greater than 5 nm and equal to or smaller than 100 nm, for example.

Each of the electron injection layer 126 of the first organic layer 120a and the electron injection layer 126 of the second organic layer 120b is formed using alkaline earth metal compounds such as LiF, metal oxides represented by aluminum oxides, or metal complexes represented by lithium 8-hydroxyquinolate (Liq) and the like. The electron injection layer 126 of the first organic layer 120a and the electron injection layer 126 of the second organic layer 120b are formed by the same step as each other, and thus have thicknesses which are substantially equal to each other. The thickness of the electron injection layer 126 is equal to or greater than 0.1 nm and equal to or smaller than 10 nm, for example.

The first organic layer 120a and the second organic layer 120b may further include an electron inhibition layer. The electron inhibition layer is positioned between the hole transport layer and the light emitting layer and suppresses an occurrence of a situation in which electrons penetrating the light emitting layer reach the hole transport layer or the hole injection layer. The electron inhibition layer can be formed using at least one of materials through which holes move (organic materials having hole mobility), for example. The thickness of the electron inhibition layer is equal to or greater than 5 nm and equal to or smaller than 50 nm, for example.

In the example illustrated in FIG. 1, the layers of the first organic layer 120a are positioned on the inner side of the first opening 152a, and the layers of the second organic layer 120b are positioned on the inner side of the second opening 152b. The hole injection layer 121, the first hole transport layer 122a, and the second hole transport layer 122b may be formed over the insulating layer 150. In this case, the hole injection layer 121 of the first organic layer 120a may be joined to the hole injection layer 121 of the second organic layer 120b, and the first hole transport layer 122a may be joined to the second hole transport layer 122b.

Figure 2:
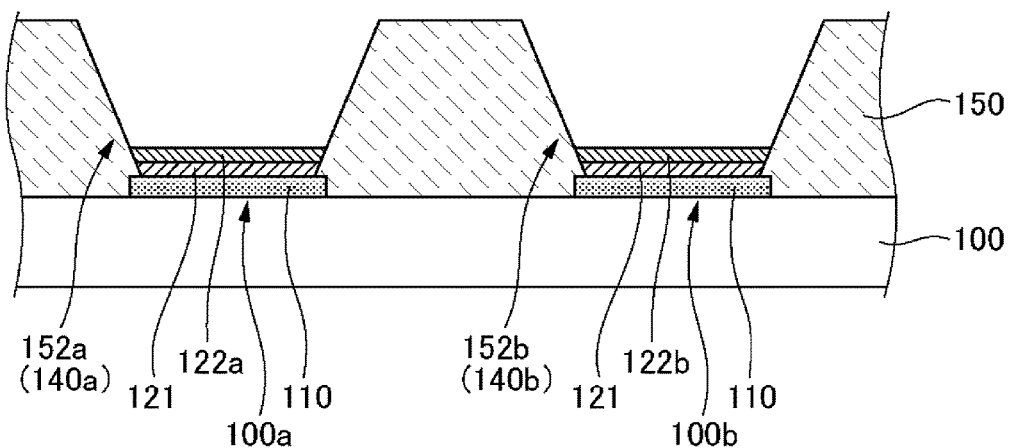
FIGS. 2(a) and 2(b) are sectional views illustrating a method of manufacturing the light emitting device.
Figure 2:
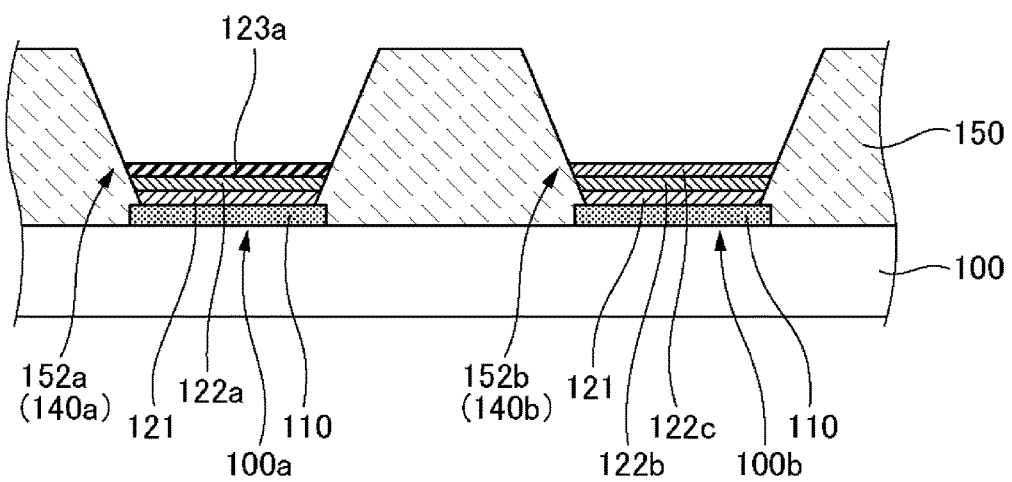
Figure 3:
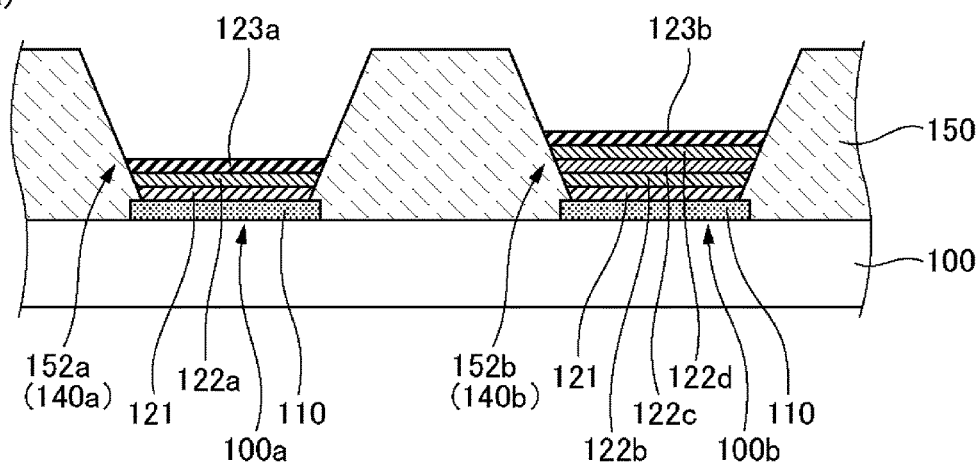
FIGS. 3(a) and 3(b) are sectional views illustrating the method of manufacturing the light emitting device.
Figure 3:
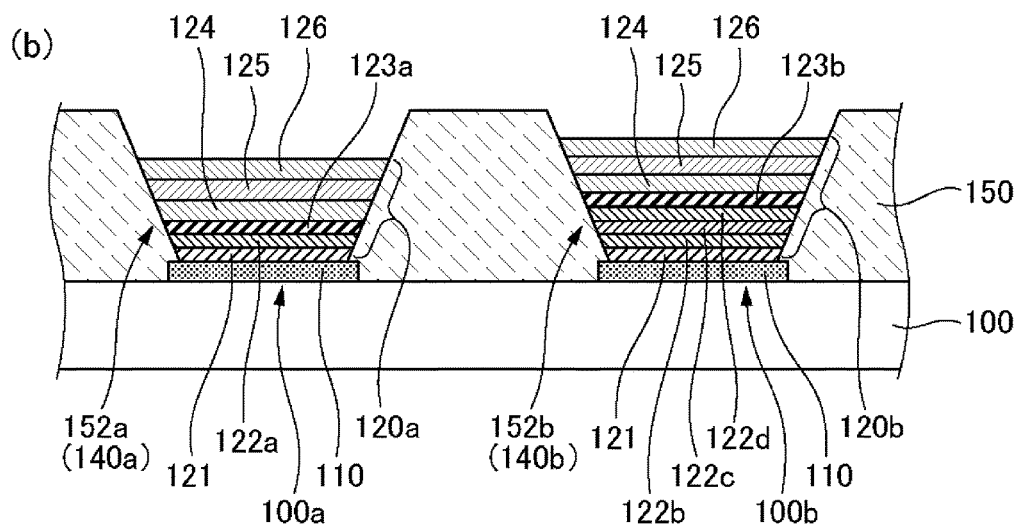

Each drawing of FIG. 2 and FIG. 3 is a sectional view illustrating a method of manufacturing the light emitting device 10. The method of manufacturing the light emitting device 10 includes steps as follows. First, the first region 100a of the substrate 100 is coated with a light emitting material (specifically, material for forming the first light emitting layer 123a) (first step). Before or after the first step, the second region 100b of the substrate 100 is coated with a coating material (specifically, second hole transporting material for forming the third hole transport layer 122c) (second step). After the first step and the second step, the light emitting material of the first region 100a and the coating material of the second region 100b are dried (third step). Then, the light emitting material is deposited in the second region 100*b* (fourth step). Details thereof will be described below.

First, as illustrated in FIG. 2(*a*), the first electrode 110 is formed in the first region 100*a* and the second region 100*b* of the substrate 100, for example, by using a vapor deposition method or a sputtering method. Then, the insulating layer 150, the first opening 152*a*, and the second opening 152*b* are formed on the substrate 100. Then, the first region 100*a* and the second region 100*b* of the substrate 100 are coated with a hole injection material, for example, by using an ink jet method, and then are dried. Thus, the hole injection layer 121 of the first light emitting unit 140*a* and the hole injection layer 121 of the second light emitting unit 140*b* are formed (seventh step).

Then, the first region 100*a* and the second region 100*b* of the substrate 100 are coated with a first hole transporting material, for example, by using an ink jet method, and then are dried. Thus, the first hole transport layer 122*a* of the first light emitting unit 140*a* and the second hole transport layer 122*b* of the second light emitting unit 140*b* are formed (fifth step).

Then, as illustrated in FIG. 2(*b*), the second region 100*b* of the substrate 100 is coated with a second hole transporting material, for example, by using an ink jet method (second step). The first region 100*a* of the substrate 100 is coated with the light emitting material for the first light emitting layer 123*a*, for example, by using an ink jet method (first step). The second step may be formed after the first step is performed.

Then, the coating material used for coating in the first step and the coating material used for coating in the second step are dried (third step). Thus, the first light emitting layer 123*a* of the first light emitting unit 140*a* and the third hole transport layer 122*c* of the second light emitting unit 140*b* are formed.

Then, as illustrated in FIG. 3(*a*), the second hole transporting material is deposited in the second region 100*b* of the substrate 100 (sixth step). Thus, the fourth hole transport layer 122*d* is formed. The light emitting material is deposited in the second region 100*b* of the substrate 100 (fourth step). Thus, the second light emitting layer 123*b* is formed.

Then, as illustrated in FIG. 3(*b*), the hole blocking layer 124 of the first organic layer 120*a* and the hole blocking layer 124 of the second organic layer 120*b* are formed by using a vacuum vapor deposition method. Then, the electron transport layer 125 of the first organic layer 120*a* and the electron transport layer 125 of the second organic layer 120*b* are formed by using a vacuum vapor deposition method. The electron injection material is deposited on the electron transport layer 125 in vacuum (eighth step). Thus, the electron injection layer 126 of the first organic layer 120*a* and the electron injection layer 126 of the second organic layer 120*b* are formed. In this manner, the first organic layer 120*a* and the second organic layer 120*b* are formed.

The second electrode 130 is formed on each of the first organic layer 120*a* and the second organic layer 120*b*. The second electrode 130 is formed by, for example, using a vapor deposition method or a sputtering method.

In the embodiment, the first light emitting layer 123*a* of the first light emitting unit 140*a* is formed by using a coating method and the second light emitting layer 123*b* of the second light emitting unit 140*b* is formed by using a vapor deposition method. In such a configuration, a difference is provided between the number of times of performing coating steps for the first light emitting unit 140*a* and the number of times of performing coating steps for the second light emitting unit 140*b*. For the organic layer formed by coating, a step of drying a solvent is required. However, here, the drying step cannot be performed only for the region of the first light emitting unit 140*a* or the region of the second light emitting unit 140*b*. The drying step is most frequently performed at once for the entire substrate 100. Here, if there is a difference in the wet state between the organic layers, poor film formation is likely to occur in the drying step. That is, since the first light emitting unit 140*a* is formed by vapor deposition, the first light emitting unit 140*a* containing a solvent is in a so-called wet state. On the contrary, since the second light emitting unit 140*b* is formed by vapor deposition, the second light emitting unit 140*b* is in a dry state. Therefore, if the drying step is performed on the light emitting device 10, a so-called drawing occurs in which the organic layer of the first light emitting unit 140*a* in the process of being dried is drawn onto the dried (not-wet) insulating layer 150 of the second light emitting unit 140*b*. If this phenomenon occurs, the film thickness of the organic layer 120 of the first light emitting layer 140*a* becomes nonuniform in the first light emitting layer 140*a*, and thus the quality of the light emitting device 10 is deteriorated.

On the contrary, in the embodiment, the third hole transport layer 122*c* is formed on the second hole transport layer 122*b* of the second light emitting unit 140*b*. The third hole transport layer 122*c* is formed by a coating method and then is dried in the same step as that for the first light emitting layer 123*a*. Thus, at the stage of performing the drying step, the organic layers have been formed in both the first light emitting unit 140*a* and the second light emitting unit 140*b* by a coating method. Therefore, the dry state of the first light emitting unit 140*a* and the dry state of the second light emitting unit 140*b* can be made uniform. As a result, it is possible to suppress an occurrence of drawing as described above, and the quality of the first light emitting unit 140*a* can be improved.

In the second light emitting unit 140*b*, the hole injection layer 121 and the second hole transport layer 122*b* are formed by using a coating method, and the third hole transport layer 122*c* and the fourth hole transport layer 122*d* are formed by using a vapor deposition method. In this case, a portion of the hole transport layer of the second light emitting unit 140*b* is formed by a coating method, and the remaining portion of the hole transport layer is formed by a vapor deposition method. Therefore, mobility of holes may decrease at an interface between the layer formed by the coating method and the layer formed by the vapor deposition method in the hole transport layer of the second light emitting unit 140*b*. On the contrary, in the embodiment, the third hole transport layer 122*c* is provided between the second hole transport layer 122*b* and the fourth hole transport layer 122*d*. The third hole transport layer 122*c* is configured of the same material as that of the fourth hole transport layer 122*d* and is formed by a coating method. Thus, it is possible to suppress the above-described decrease in the mobility of holes. Accordingly, it is possible to suppress degradation in light emission efficiency of the second light emitting unit 140*b*.

Example 1

Figure 4:
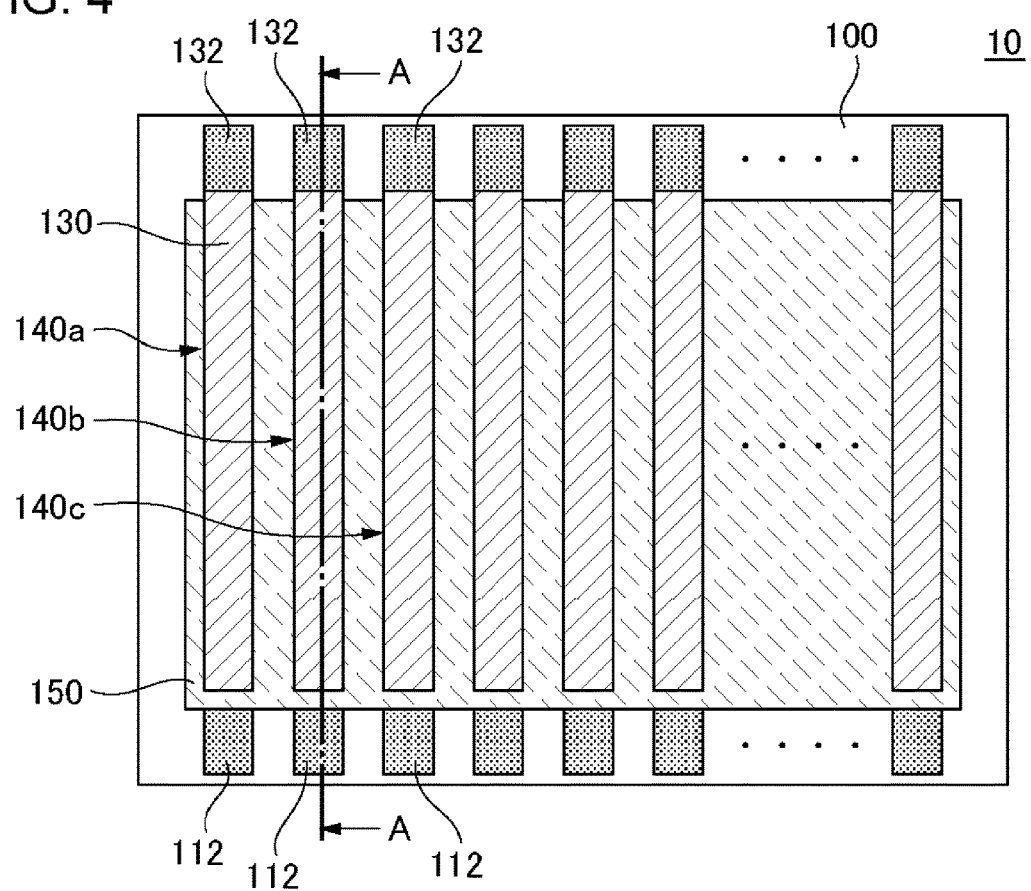
FIG. 4 is a plan view illustrating a light emitting device according to Example 1.
Figure 5:
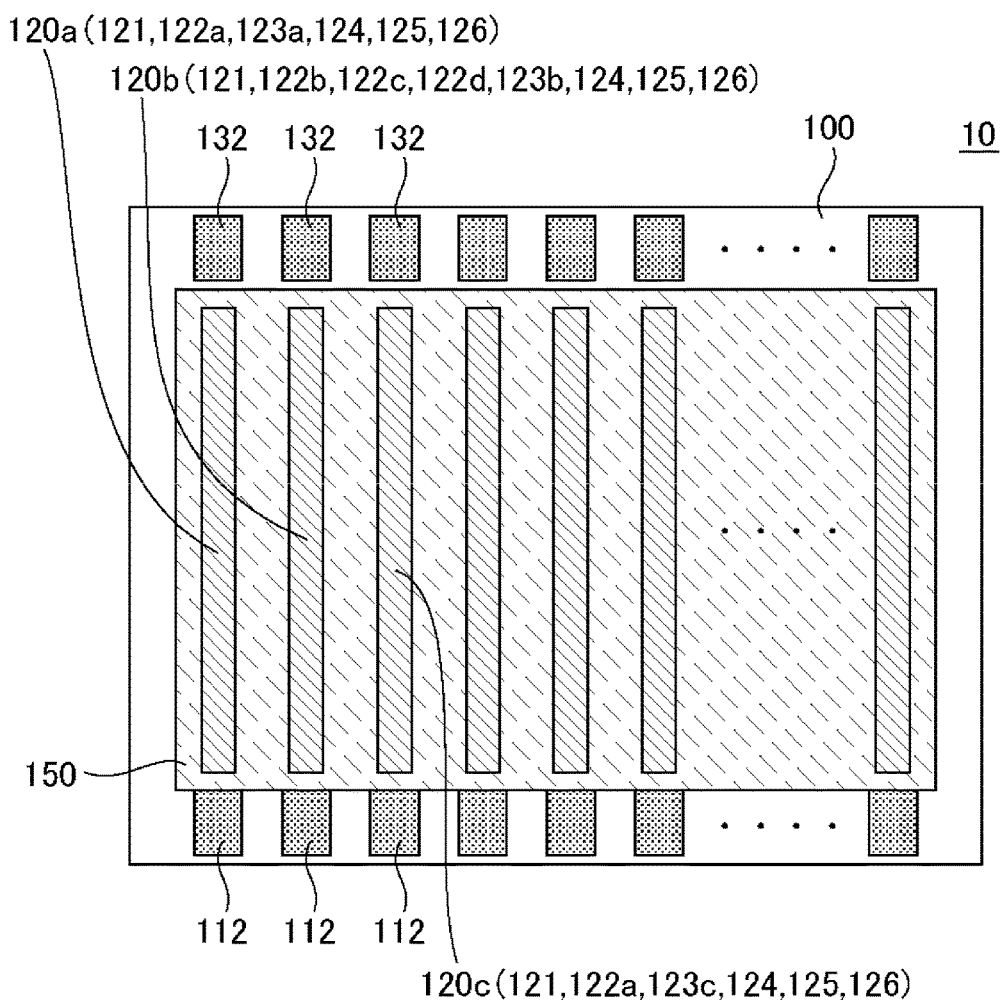
FIG. 5 is a view in which a second electrode is removed from FIG. 4.
Figure 6:
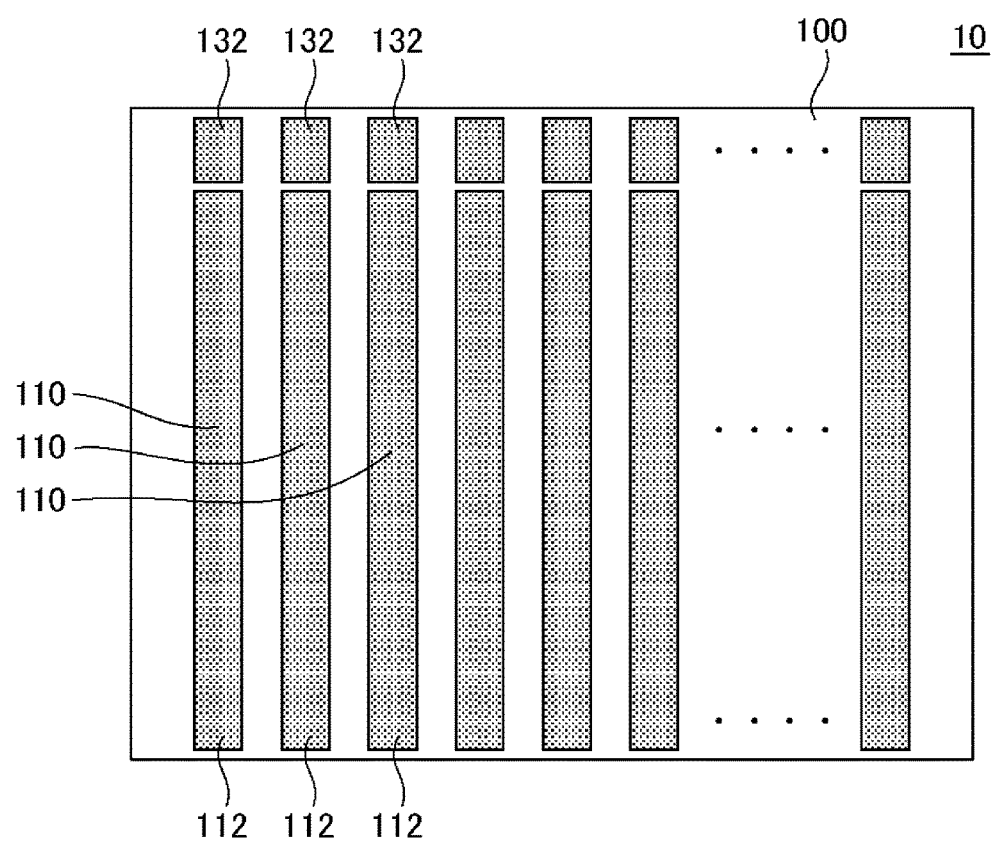
FIG. 6 is a view in which an organic layer and an insulating layer are removed from FIG. 5.
Figure 7:
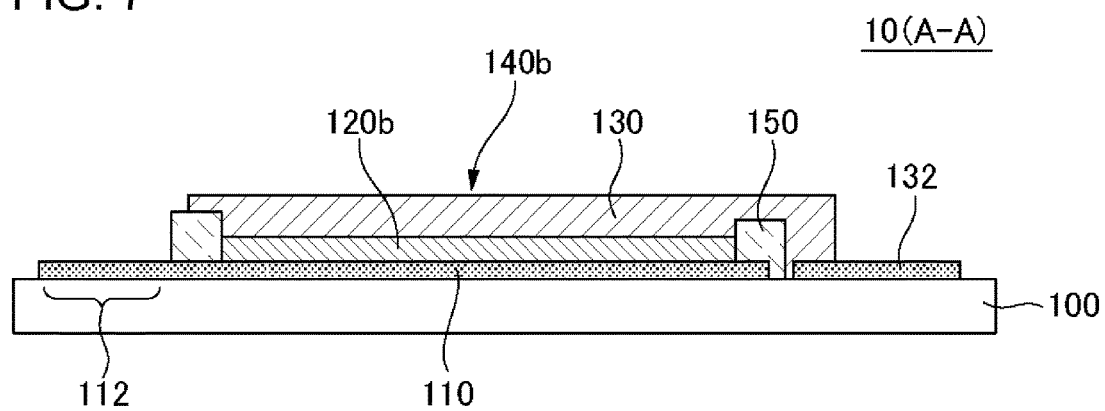
FIG. 7 is a sectional view taken along line A-A in FIG. 4.

FIG. 4 is a plan view illustrating the light emitting device 10 according to Example 1. FIG. 5 is a view in which the second electrode 130 is removed from FIG. 4. FIG. 6 is a view in which the organic layer 120 and the insulating layer 150 are removed from FIG. 5. FIG. 7 is a sectional view taken along line A-A in FIG. 4. The light emitting device 10 according to Example 1 is a lighting device. A light emitting region is formed on the substantially entire surface of the substrate 100. The first light emitting unit 140a, the second light emitting unit 140b, and a third light emitting unit 140c are repeatedly formed in the light emitting region. Each of the first light emitting unit 140a, the second light emitting unit 140b, and the third light emitting unit 140c extends to have a striped pattern (in the form of a line).

The configurations of the first light emitting unit 140a and the second light emitting unit 140b are as described in the embodiment. The third light emitting unit 140c has the same configuration as that of the first light emitting unit 140a except that the third light emitting unit includes a third light emitting layer 123c instead of the first light emitting layer 123a. The material of the third light emitting layer 123c is different from the material of the first light emitting layer 123a. In other words, the third organic layer 120c of the third light emitting unit 140c has the same configuration as that of the first organic layer 120a of the first light emitting unit 140a except for the light emitting layer. The light emission color of one of the first light emitting unit 140a and the third light emitting unit 140c is red, and the light emission color of the other unit is green. The light emission color of the second light emitting unit 140b is blue.

Each of the first light emitting unit 140a, the second light emitting unit 140b, and the third light emitting unit 140c includes the first electrode 110, a first terminal 112, the second electrode 130, and a second terminal 132. In the embodiment, the light emitting device 10 is a dimmable lighting device. Therefore, the first electrode 110, the first terminal 112, the second electrode 130, and the second terminal 132 are separately provided for each light emitting unit. However, the second terminal 132 may be a common terminal for all the light emitting units. In this case, the second electrode 130 may also be a common electrode (so-called solid electrode) for all the light emitting units. In a case where the light emitting device 10 does not have a dimming function (for example, in a case where the light emitting device 10 is a white-light lighting device), the first terminal 112 may be a common terminal for all the light emitting units. In this case, the first electrode 110 may also be a common electrode (so-called solid electrode) for all the light emitting units.

The first terminal 112 and the second terminal 132 have a layer formed using the same material as that of the first electrode 110. This layer is formed in the same step as that for the first electrode 110. The layer formed by the same material as that of the first electrode 110, in the first terminal 112, is integrated with the first electrode 110. On the other hand, the second terminal 132 is separated from the first electrode 110.

The first terminal 112 and the second terminal 132 are positioned on sides which are opposite to each other with the first electrode 110 interposed therebetween. In the example illustrated in the drawings, the substrate 100 is rectangular. The first terminal 112 is formed along one side of the substrate 100. The second terminal 132 is formed along a side on an opposite side of the first terminal 112 among the four sides of the substrate 100.

The insulating layer 150 has the first opening 152a, the second opening 152b, and a third opening 152c. The first opening 152a is positioned in a region in which the first light emitting unit 140a is to be formed. The second opening 152b is positioned in a region in which the second light emitting unit 140b is to be formed. The third opening 152c is positioned in a region in which the third light emitting unit 140c is to be formed. A portion of the second electrode 130 extends over the second terminal 132 across the insulating layer 150.

In the present example, the method of manufacturing the first light emitting unit 140a and the second light emitting unit 140b is as described in the embodiment. The third light emitting unit 140c is formed in the same step as that for the first light emitting unit 140a except that the third light emitting layer 123c is formed using a different coating material from that of the first light emitting layer 123a. Therefore, the coating material for the third light emitting layer 123c is dried in the same step as that for the coating material for the first light emitting layer 123a and the coating material for the third hole transport layer 122c.

In the present example, the third hole transport layer 122c is also formed on the second hole transport layer 122b of the second light emitting unit 140b. The third hole transport layer 122c is formed by a coating method and is dried in the same step as that for the first light emitting layer 123a and the third light emitting layer 123c. Therefore, it is possible to make each of the dry state of the layer of the first organic layer 120a, which is formed by the coating method, the dry state of the layer of the second organic layer 120b, which is formed by the coating method, and the dry state of the layer of the third organic layer 120c, which is formed by the coating method, be the optimum state. As a result, the quality of the first light emitting unit 140a, the quality of the second light emitting unit 140b, and the quality of the third light emitting unit 140c are improved.

Similar to the embodiment, it is possible to suppress the decrease of mobility of holes in the hole transport layer of the second light emitting unit 140b. Accordingly, it is possible to suppress degradation in light emission efficiency of the second light emitting unit 140b.

Example 2

Figure 8:
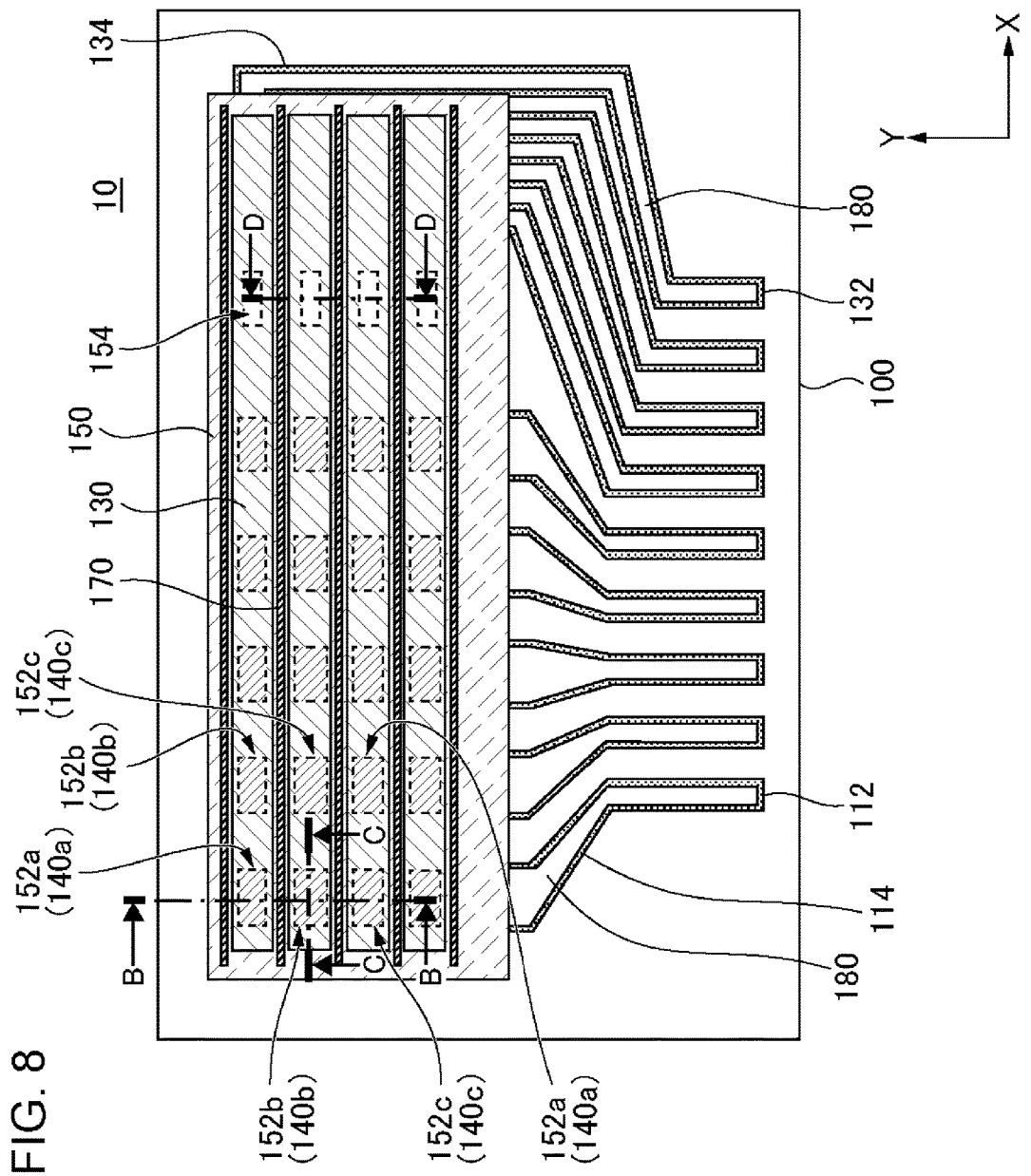
FIG. 8 is a plan view illustrating a light emitting device according to Example 2.
Figure 9:
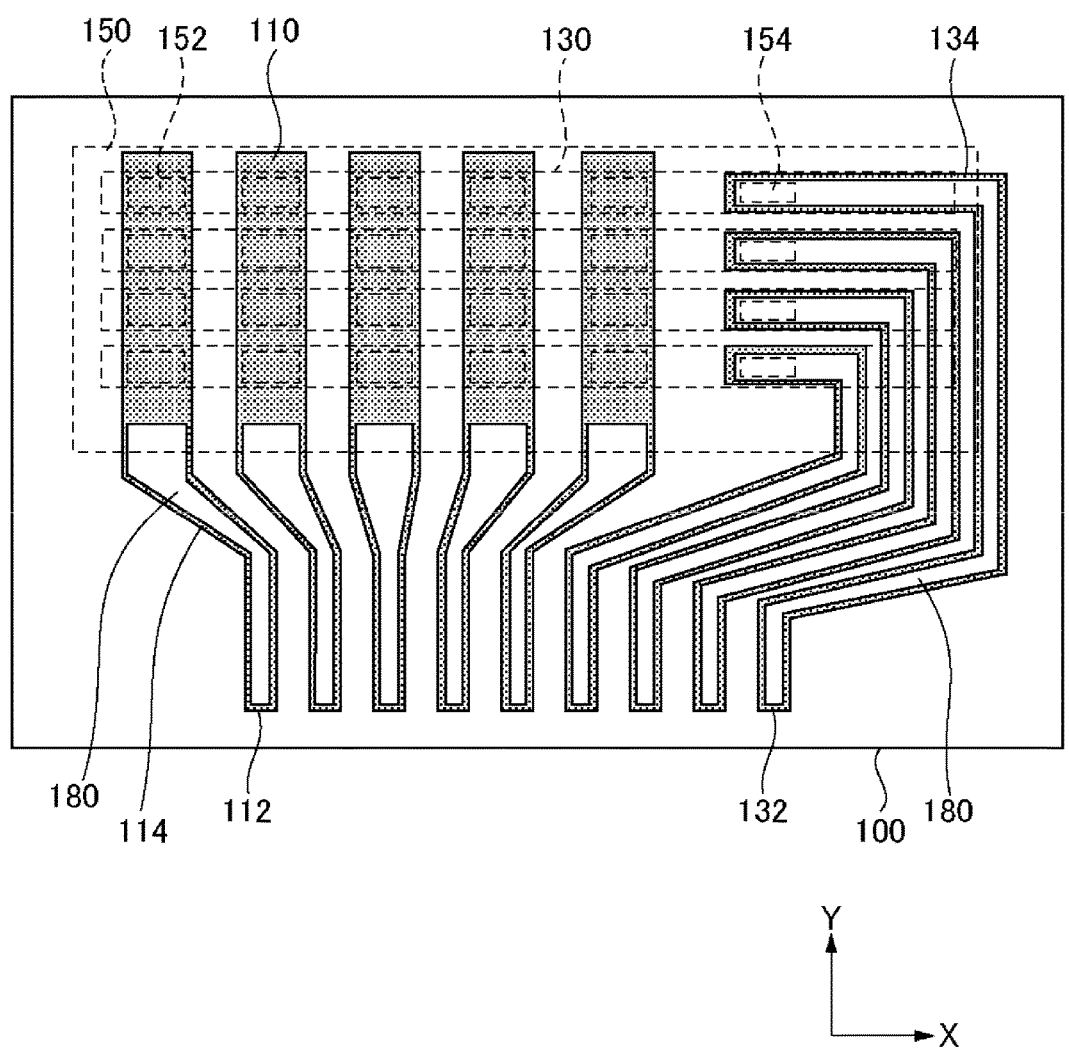
FIG. 9 is a view in which a partition wall, a second electrode, an organic layer, and an insulating layer are removed from FIG. 8.
Figure 10:
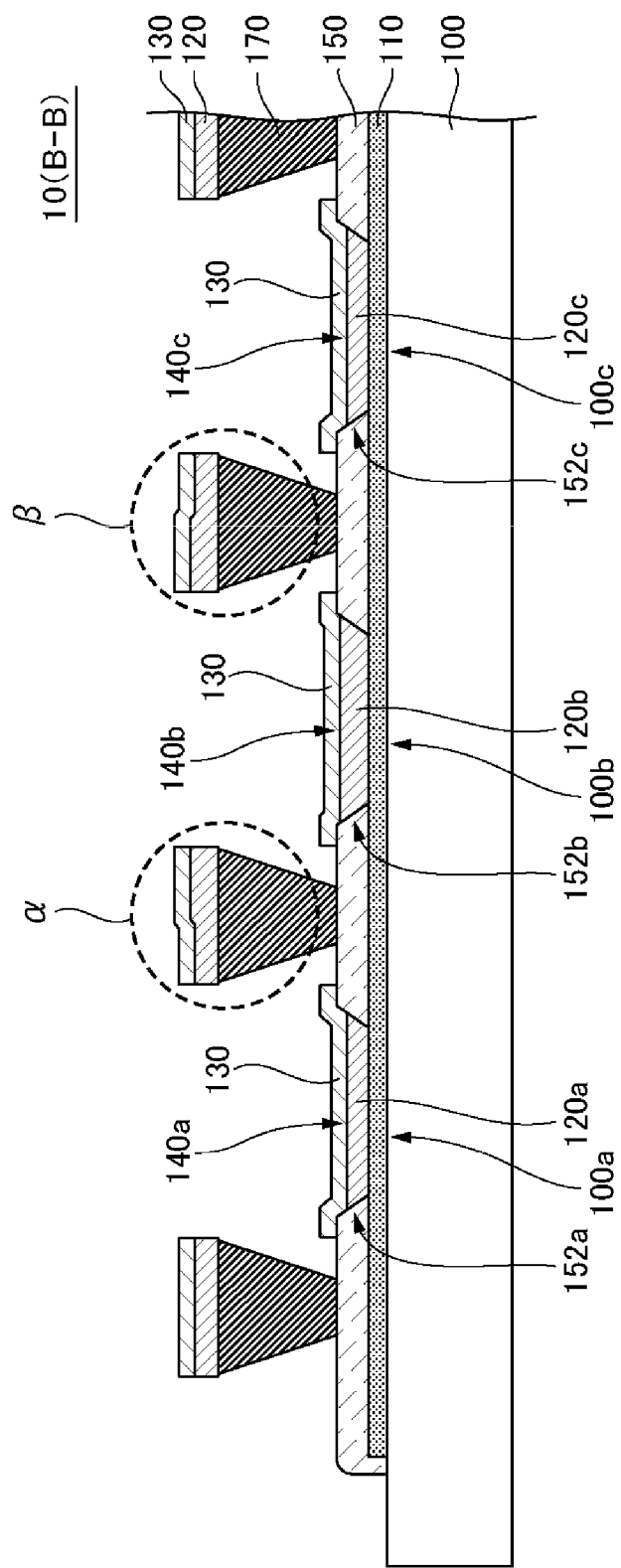
FIG. 10 is a sectional view taken along line B-B in FIG. 8.
Figure 12:
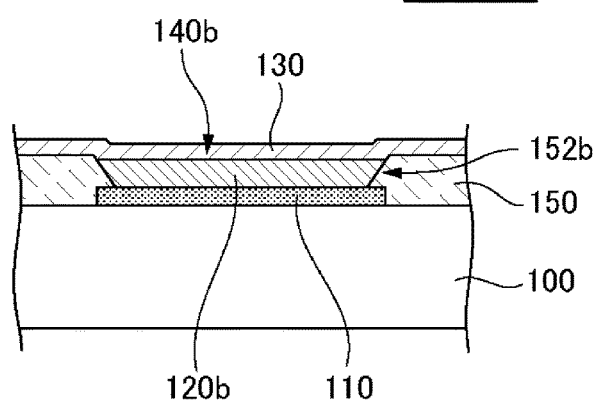
FIG. 12 is a sectional view taken along line C-C in FIG. 8.
Figure 13:
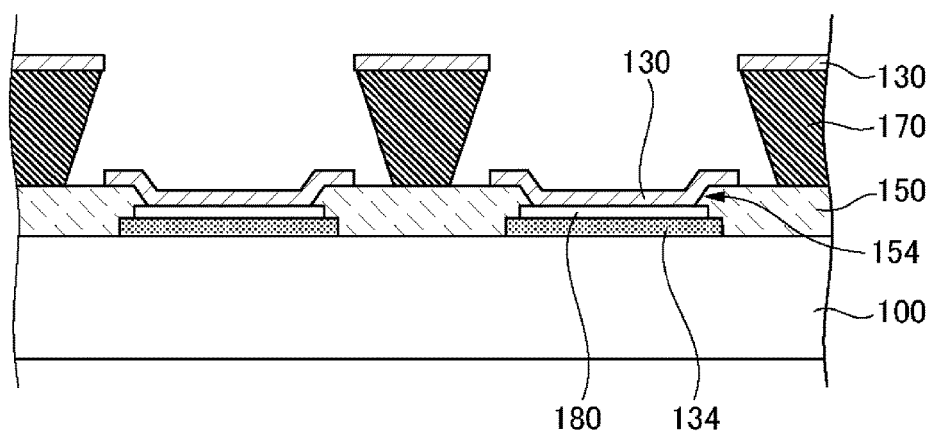
FIG. 13 is a sectional view taken along line D-D in FIG. 8.

FIG. 8 is a plan view illustrating the light emitting device 10 according to Example 2. FIG. 9 is a view in which the partition wall 170, the second electrode 130, the organic layer 120, and the insulating layer 150 are removed from FIG. 8. FIG. 10 is a sectional view taken along line B-B in FIG. 8. FIG. 11(a) is an enlarged view illustrating a region surrounded by a dotted line α in FIG. 10. FIG. 11(b) is an enlarged view illustrating a region surrounded by a dotted line β in FIG. 10. FIG. 12 is a sectional view taken along line C-C in FIG. 8. FIG. 13 is a sectional view taken along line D-D in FIG. 8.

The light emitting device 10 according to Example 2 is a display. The light emitting device 10 includes the substrate 100, the first electrode 110, a plurality of first light emitting units 140a, a plurality of second light emitting units 140b, a plurality of third light emitting units 140c, the light emitting unit 140, the insulating layer 150, a plurality of first openings 152a, a plurality of second openings 152b, a plurality of third openings 152c, a plurality of openings 154, a plurality of lead wires 114, the organic layer 120, the second electrode 130, a plurality of lead wires 134, and a plurality of partition walls 170.

The first electrode 110 linearly extends in a first direction (Y-direction in FIG. 8). The end portion of the first electrode 110 is connected to the lead wire 114.

The lead wire 114 is a wire that connects the first electrode 110 to the first terminal 112. In the example illustrated in FIGS. 8 to 12, one end of the lead wire 114 is connected to the first electrode 110 and the other end of the lead wire 114 serves as the first terminal 112. In the example illustrated in FIGS. 8 to 12, the first electrode 110 and the lead wire 114 are integrated. A conductive layer 180 is formed on the first terminal 112 and on the lead wire 114. The conductive layer 180 is formed using metal having resistance lower than the first electrode 110, for example, Al or Ag. One end of the lead wire 114 is covered by the insulating layer 150.

As illustrated in FIGS. 8 and 10 to 13, the insulating layer 150 is formed on the plurality of first electrodes 110 and in regions between the plurality of first electrodes. The plurality of first openings 152a, the plurality of second openings 152b, the plurality of third openings 152c, and the plurality of openings 154 are formed in the insulating layer 150. The plurality of second electrodes 130 extend in parallel to each other in a direction intersecting the first electrode 110 (for example, direction orthogonal to the first electrode: X-direction in FIG. 8). The partition walls 170 which will be described later in detail extend between the plurality of second electrodes 130. Each of the first openings 152a, the second openings 152b, and the third openings 152c is positioned at intersection points between the first electrodes 110 and the second electrodes 130. The first openings 152a, the second openings 152b, and the third openings 152c are arranged to form matrices.

The openings 154 are positioned in regions overlapping respective one ends of the plurality of second electrodes 130 in plan view. The openings 154 are arranged along one side of a matrix formed by the openings 152. In a case of being viewed in a direction along the one side (for example, Y-direction in FIG. 8, that is, direction along the first electrode 110), the openings 154 are arranged at a predetermined interval. A portion of the lead wire 134 is exposed from the opening 154. The lead wire 134 is connected to the second electrode 130 via the opening 154.

The lead wire 134 is a wire that connects the second electrode 130 to the second terminal 132 and includes a layer formed of the same material as that of the first electrode 110. One end of the lead wire 134 is positioned below the opening 154, and the other end of the lead wire 134 is drawn to the outside of the insulating layer 150. In the example illustrated in FIGS. 8 to 12, the other end of the lead wire 134 serves the second terminal 132. The conductive layer 180 is formed on the second terminal 132 and on the lead wire 134. A portion of the lead wire 134 is covered by the insulating layer 150.

The first organic layer 120a is formed on the inner side of the first opening 152a, the second organic layer 120b is formed on the inner side of the second opening 152b, and the third organic layer 120c is formed on the inner side of the third opening 152c. Each configuration of the first organic layer 120a, the configuration of the second organic layer 120b, and the configuration of the third organic layer 120c is as described in Example 1. At least some layer of each organic layer may protrude to the outside of each of the openings. As illustrated in FIG. 13, no organic layer is formed in the openings 154.

As illustrated in FIGS. 8 and 10 to 13, the second electrode 130 extends in a second direction intersecting the first direction (X-direction in FIG. 8). The partition wall 170 is formed between the second electrodes 130 which are adjacent to each other. The partition wall 170 extends in parallel to the second electrode 130, that is, extends in the second direction. The base of the partition wall 170 is, for example, the insulating layer 150. The partition wall 170 is made of, for example, a photosensitive resin such as a polyimide resin and is formed to have a desired pattern by being exposed and developed. The partition wall 170 may be formed of a resin other than the polyimide resin, for example, may be formed of an epoxy resin, an acrylic resin, or an inorganic material such as silicon dioxide.

The partition wall 170 has a shape having a trapezoidal section (inverted trapezoid) which is reversed upside down. That is, the width of the upper surface of the partition wall 170 is wider than the width of the lower surface of the partition wall 170. Therefore, when the partition wall 170 is formed ahead of the second electrode 130, the plurality of second electrodes 130 can be formed at once by forming the second electrodes 130 on one surface side of the substrate 100 by vapor deposition or by sputtering.

The partition wall 170 also has a function of dividing the organic layer 120. For example, the layers formed by the coating method among the layers constituting the organic layer 120 (for example, hole injection layer 121, first hole transport layer 122a, second hole transport layer 122b, third hole transport layer 122c, first light emitting layer 123a, and third light emitting layer 123c) are formed by coating the regions between the partition walls 170 with the coating material. On the other hand, the layers formed by the vapor deposition method in the organic layer 120 (for example, fourth hole transport layer 122d, second light emitting layer 123b, hole blocking layer 124, electron transport layer 125, and electron injection layer 126) are not formed on the side surfaces of the partition walls 170, and thus are divided by the partition walls 170.

As illustrated in FIG. 11(a), only the layers formed by the vapor deposition method in the first organic layer 120a, specifically, only the hole blocking layer 124, the electron transport layer 125, and the electron injection layer 126 are formed on the upper surface of the region of the partition wall 170, which is adjacent to the first light emitting unit 140a. The hole injection layer 121, the first hole transport layer 122a, and the first light emitting layer 123a are not formed on the above upper surface. Therefore, the organic layer positioned on the partition wall 170 in the vicinity of the first light emitting unit 140a is thinner than the first organic layer 120a positioned in the first opening 152a.

Similarly, as illustrated in FIG. 11(b), only the layers formed by the vapor deposition method in the third organic layer 120c, specifically, only the hole blocking layer 124, the electron transport layer 125, and the electron injection layer 126 are formed on the upper surface of the region of the partition wall 170, which is adjacent to the third light emitting unit 140c. The hole injection layer 121, the first hole transport layer 122a, and the third light emitting layer 123c are not formed on the above upper surface. Therefore, the organic layer positioned on the partition wall 170 in the vicinity of the third light emitting unit 140c is thinner than the third organic layer 120c positioned in the third opening 152c.

As illustrated in FIGS. 11(a) and 11(b), only the layers formed by vapor deposition in the second organic layer 120b, specifically, only the fourth hole transport layer 122d, the second light emitting layer 123b, the hole blocking layer 124, the electron transport layer 125, and the electron injection layer 126 are formed on the upper surface of the region of the partition wall 170, which is adjacent to the second light emitting unit 140b. The hole injection layer 121, the second hole transport layer 122b, and the third hole transport layer 122c are not formed on the above upper surface. In other words, the hole injection layer 121 and a portion of the hole transport layer of the second light emitting unit 140b are formed on the upper surface of the partition wall 170 positioned to be adjacent to the second light emitting unit 140b in the thickness direction, and the remaining portion of the hole transport layer and the second light emitting layer 123b of the second light emitting unit 140b are formed on the upper surface of the partition wall 170. The organic layer positioned on the partition wall 170 in the vicinity of the second light emitting unit 140b is thinner than the second organic layer 120b in the second light emitting unit 140b.

Figure 11:
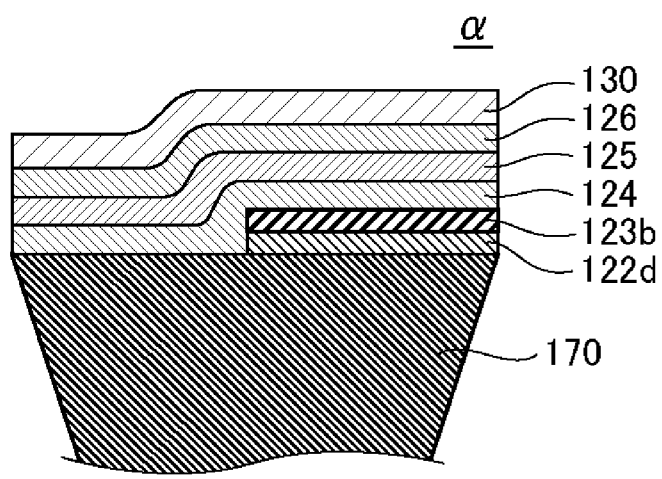
FIG. 11(a) is an enlarged view illustrating a region surrounded by a dotted line α in FIG. 10.
FIG. 11(b) is an enlarged view illustrating a region surrounded by a dotted line β.
Figure 11:
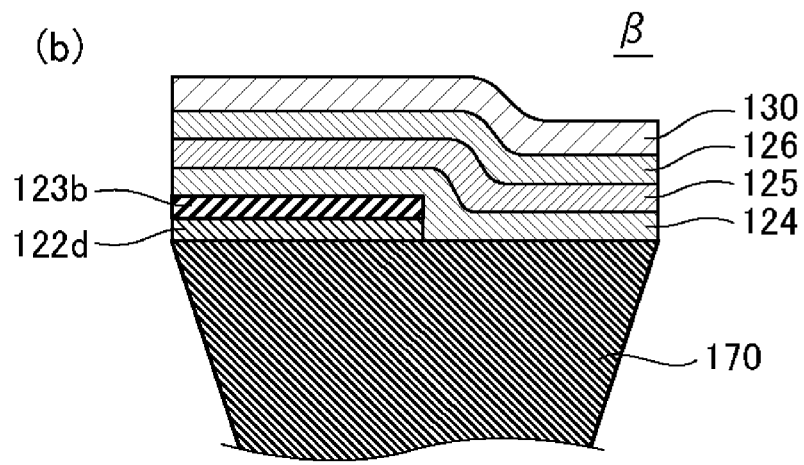

As illustrated in FIGS. 10 and 11, the organic layer positioned on the region of the partition wall 170, which is adjacent to the second light emitting unit 140b is thicker than any of the organic layer positioned on the region of the partition wall 170, which is adjacent to the first light emitting unit 140a and the organic layer positioned on the region of the partition wall 170, which is adjacent to the third light emitting unit 140c. The reason is that the second organic layer 120b includes the fourth hole transport layer 122d, and the second light emitting layer 123b is formed by vapor deposition.

Next, the method of manufacturing the light emitting device 10 in Example 2 will be described. First, the first electrode 110 and the lead wires 114 and 134 are formed on the substrate 100. The method of forming the above components is similar to the method of forming the first electrode 110 in the embodiment.

Then, the conductive layer 180 is formed on the lead wire 114, the first terminal 112, the lead wire 134, and the second terminal 132. The insulating layer 150, the first opening 152a, the second opening 152b, and the third opening 152c are formed, and the partition wall 170 is formed. Then, the layers of the first organic layer 120a, the layers of the second organic layer 120b, and the layers of the third organic layer 120c are formed. The methods of forming the layers are as described in Example 1. Then, the second electrode 130 is formed.

Similar to Example 1, in Example 2, each of the quality of the first light emitting unit 140a, the quality of the second light emitting unit 140b, and the quality of the third light emitting unit 140c are improved. Similar to the embodiment, it is possible to suppress the decrease in the mobility of holes in the hole transport layer of the second light emitting unit 140b. Accordingly, it is possible to suppress degradation in light emission efficiency of the second light emitting unit 140b.

Hitherto, the embodiment and the examples are described with reference to the drawings. However, these are just an example of the present invention, and various configurations other than the above descriptions can be employed.

The invention claimed is:

1. A method of manufacturing a light emitting device, the method comprising:
    a first step of coating a first region of a substrate, in which a first light emitting unit is formed, with a first solution comprising a light emitting material;
    a second step of coating a second region of a substrate, in which a second light emitting unit is formed, with a second solution comprising a coating material, before or after the first step;
    a third step of drying the first solution in the first region and the second solution in the second region after the first step and the second step; and
    a fourth step of depositing a light emitting material in the second region after the third step.

2. The method of manufacturing a light emitting device according to claim 1, further comprising:
    a fifth step of coating the first region and the second region with a first hole transporting material before the first step and the second step.

3. The method of manufacturing a light emitting device according to claim 2,
    wherein the second solution used in the second step is a second hole transporting material.

4. The method of manufacturing a light emitting device according to claim 3, further comprising:
    a sixth step of depositing the second hole transporting material in the second region in a period between the third step and the fourth step.

5. The method of manufacturing a light emitting device according to claim 4,
    wherein a molecular weight of the first hole transporting material is higher than that of the second hole transporting material.

6. The method of manufacturing a light emitting device according to claim 2, further comprising:
    a seventh step of coating the first region and the second region with a hole injection material before the fifth step.

7. The method of manufacturing a light emitting device according to claim 6,
    wherein a molecular weight of the hole injection material is higher than that of the second solution used in the second step.

8. The method of manufacturing a light emitting device according to claim 1,
    wherein a peak wavelength of an emission spectrum of the first light emitting unit is longer than a peak wavelength of an emission spectrum of the second light emitting unit.

9. The method of manufacturing a light emitting device according to claim 1,
    wherein an ink jet method is used in the first step and the second step.

10. The method of manufacturing a light emitting device according to claim 1, further comprising:
    an eighth step of depositing an electron injection material after the fourth step.

11. A light emitting device comprising:
    a first light emitting unit positioned in a first region of a substrate; and
    a second light emitting unit positioned in a second region of the substrate,
    wherein the first light emitting unit comprises:
        a first hole injection layer;
        a first hole transport layer positioned on the first hole injection layer; and
        a first light emitting layer positioned on the first hole transport layer, and
    the second light emitting unit comprises:
        a second hole injection layer;
        a second hole transport layer which is positioned on the second hole injection layer and comprises a first hole transporting material;
        a third hole transport layer which is positioned on the second hole transport layer and comprises a second hole transporting material;
        a fourth hole transport layer which is positioned on the third hole transport layer and comprises the second hole transporting material; and
        a second light emitting layer positioned on the fourth hole transport layer.

12. The light emitting device according to claim 11,
    wherein a refractive index of the third hole transport layer is different from a refractive index of the fourth hole transport layer.

13. The light emitting device according to claim 11, wherein the first hole transport layer comprises the first hole transporting material.

14. The light emitting device according to claim 11, further comprising:
a substrate;
an insulating layer which is positioned on the substrate and comprises a plurality of openings; and
a partition wall positioned on a portion of the insulating layer, the portion of the insulating layer positioned between adjacent openings,
wherein the first light emitting unit is positioned on an inner side of a first opening among the openings,
the second light emitting unit is positioned on an inner side of a second opening among the openings, and
the first hole transport layer, the second hole transport layer, the third hole transport layer, and the first light emitting layer are not positioned on the partition wall, and the fourth hole transport layer and the second light emitting layer are positioned on at least a portion of the partition wall.

15. The light emitting device according to claim 11, wherein a peak wavelength of an emission spectrum of the first light emitting unit is longer than a peak wavelength of an emission spectrum of the second light emitting unit.

16. A light emitting device comprising:
a substrate;
an insulating layer which is positioned on the substrate and comprises a plurality of openings;
a partition wall positioned on a portion of the insulating layer, the portion of the insulating layer positioned between adjacent openings;
a first light emitting unit positioned in a first opening among the openings; and
a second light emitting unit positioned in a second opening among the openings,
wherein the first light emitting unit comprises:
a first hole injection layer;
a first hole transport layer positioned on the first hole injection layer; and
a first light emitting layer positioned on the first hole transport layer,
the second light emitting unit comprises:
a second hole injection layer;
a second hole transport layer which is positioned on the second hole injection layer and is thicker than the first hole transport layer, the second hole transport layer comprising a plurality of layers; and
a second light emitting layer positioned on the second hole transport layer, and
the second hole injection layer and at least one of the plurality of layers of the second hole transport layer are not positioned on the partition wall and at least another one of the plurality of layers of the second hole transport layer and the second light emitting layer are positioned on the partition wall, the partition wall being positioned adjacent to the second light emitting unit.

* * * * *